United States Patent
Todokoro et al.

(10) Patent No.: US 6,872,944 B2
(45) Date of Patent: Mar. 29, 2005

(54) SCANNING ELECTRON MICROSCOPE

(75) Inventors: Hideo Todokoro, Nishitama-gun (JP); Shou Takami, Hitachinaka (JP); Makoto Ezumi, Mito (JP); Osamu Yamada, Hitachinaka (JP); Yoichi Ose, Mito (JP); Tomohiro Kudo, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/699,793

(22) Filed: Nov. 4, 2003

(65) Prior Publication Data
US 2004/0089805 A1 May 13, 2004

Related U.S. Application Data

(63) Continuation of application No. 09/486,042, filed as application No. PCT/JP99/00990 on Mar. 1, 1999, now Pat. No. 6,667,476.

(30) Foreign Application Priority Data

| Mar. 9, 1998 | (JP) | 10-056417 |
| Sep. 14, 1998 | (JP) | 10-259679 |
| Sep. 14, 1998 | (JP) | 10-259681 |

(51) Int. Cl.[7] .............................................. H01J 37/28
(52) U.S. Cl. ...................................... 250/310; 250/305
(58) Field of Search ............................... 250/310, 305, 250/306, 307, 397, 398

(56) References Cited

U.S. PATENT DOCUMENTS

| 4,922,097 | A | | 5/1990 | Todokoro et al. ........... 250/310 |
| 5,389,787 | A | | 2/1995 | Todokoro et al. |
| 5,424,541 | A | | 6/1995 | Todokoro et al. |
| 5,517,028 | A | | 5/1996 | Ito et al. ....................... 250/310 |
| 5,608,218 | A | | 3/1997 | Sato et al. |
| 5,872,358 | A | | 2/1999 | Todokoro et al. ........... 250/310 |
| 5,936,244 | A | * | 8/1999 | Yajima et al. ............... 250/310 |
| 6,025,593 | A | | 2/2000 | Suzuki et al. ................ 250/310 |
| 6,037,589 | A | | 3/2000 | Yonezawa et al. ........... 250/310 |
| 6,172,363 | B1 | * | 1/2001 | Shinada et al. .............. 250/310 |
| 6,348,690 | B1 | * | 2/2002 | Iwabuchi et al. ............ 250/310 |
| 6,653,631 | B2 | * | 11/2003 | Nishimura ................... 250/310 |

FOREIGN PATENT DOCUMENTS

| JP | 59-001916 | 1/1984 |
| JP | 60-061238 | 3/1985 |
| JP | 60-146439 | 8/1985 |
| JP | 61-220259 | 9/1986 |
| JP | 5-266855 | 10/1993 |
| JP | 6-139985 | 5/1994 |
| JP | 7-192679 | 7/1995 |
| JP | 9-171791 | 6/1997 |

* cited by examiner

*Primary Examiner*—Kiet T. Nguyen
(74) *Attorney, Agent, or Firm*—Kenyon & Kenyon

(57) ABSTRACT

The present invention relates to a scanning electron microscope employing a deceleration field forming technology (retarding), more particularly a scanning electron microscope which separates and detects secondary electrons at high efficiency.

The object of the present invention is accomplished by providing an electron source, a lens for condensing the primary electron beam which is emitted from said electron source, a detector for detecting electrons which are generated by radiation of the primary electron beam onto a specimen, a first deceleration means for decelerating the primary electron beam which is radiated onto said specimen, a second deceleration means for decelerating electrons which are generated on the specimen, and a deflector for deflecting said electrons which are decelerated by said second decelerating means.

6 Claims, 16 Drawing Sheets

TO SAMPLE

US 6,872,944 B2

SCANNING ELECTRON MICROSCOPE

This is a continuation of application Ser. No. 09/486,042 filed 17 Feb. 2000, now U.S. Pat. No. 6,667,476, which is a 371 of PCT/JP99/00990 filed 1 Mar. 1999, the contents of which are incorporated herein by reference.

FIELD OF THE INVENTION

The present invention relates to a scanning electron microscope, more particularly to a scanning electron microscope for obtaining high-resolution scanning images at a low acceleration voltage.

BACKGROUND OF THE INVENTION

A scanning electron microscope (hereinafter shorted as SEM in this specification) obtains a magnified 2-dimensional scanning image of an object to be examined by emitting a beam of electrons from a heating type or a field emission type, concentrating it by an electrostatic or magnetic lens into a fine electron beam (a primary electron beam), applying the electron beam onto the object to be examined in a 2-dimensional scanning manner, detecting a secondary signal electrons that are secondarily generated or reflected from the object, and feeding the magnitude of the detected signal to the brightness modulation of a CRT tube which is scanned in synchronism with the primary electron beam.

A conventional SEM emits electrons from an electron source to which a negative voltage is applied, accelerates them by anodes of a grounding voltage, and applies the accelerated electrons (a primary electron beam) to an object to be examined at a grounding voltage.

Recently, semiconductor chips have become smaller and their circuit patterns have become extremely fine. Accordingly, SEMs have been widely used in place of optical microscopes to inspect manufacturing processes of semiconductor chips and processed semiconductor chips (e.g. by measurement of dimensions by electron beams and inspection of electric operations), Semiconductor specimens to be examined by the SEM are generally made of a multiple layers of electrically-insulating materials on a conductor such as aluminum or silicon. When an electron beam is applied to such a specimen, the surface of the specimen is charged up, which will change the direction of motion of the emitted secondary electrons or the primary electrons themselves. Consequently, the resulting images may have an extraordinary contrast, distortion, or the like. To reduce the influence by this charging up, the energy of the emitted electron beam must be made as low as possible.

However, if the energy of the emitted electron beam (an acceleration voltage) is made low, a chromatic aberration due to energy dispersion of the electron beam generates and the resolving power of the SEM drastically goes down, which makes observation at a high magnification harder.

As a means for solving such a problem, a technology for forming a deceleration field for electron beams (hereinafter called "retarding" in this specification) has been disclosed in Japanese Non-examined Patent Publication No.06-139985 (1994).

"Retarding" is a technology of forming a deceleration field by increasing the voltage to accelerate the electron beam to the anodes and applying a negative potential to the object to be examined, finally setting the acceleration voltage to a comparatively low level, and thus preventing chromatic aberration and charging up.

DISCLOSURE OF INVENTION

Although this retarding technology can reduce the charging-up of a specimen and accomplish low chromatic aberration and high resolving power, it has the following demerits:

While the deceleration field which is formed by applying a negative voltage to the specimen can decelerate the motion of the primary electron beam, it accelerates the secondary electrons and the reflected electrons generated by the specimen. In other words, the secondary electrons as well as the reflected electrons are refracted to the electron beam with a high energy.

Japanese Non-examined Patent Publication No.06-139985 (1994) has disclosed a technology as a means for detecting electrons having such a high energy. This technology places a micro channel plate (MCP) having an aperture to pass the primary electron beam with its detection surface opposite to the specimen. This technology also places an energy filter which selectively detects reflected electrons between the specimen and the detecting surface of the micro channel plate.

Some other technologies have also been disclosed. One of such technologies has been disclosed in Japanese Non-examined Patent Publication No.09-171791 (1997). This technology causes high-energy electrons to collide against a reflecting plate, converts them into secondary electrons, then guides the secondary electrons into a detector. Japanese Non-examined Patent Publication No.08-124513 (1996) has disclosed another technology which detects electrons by striking electrons directly against an electron multiplier tube.

However, as the scanning electron microscopes using these detection principles detect both secondary electrons and reflected electrons by an identical detector. Accordingly, this type of SEM cannot distinguish secondary electrons from reflected electrons clearly.

Although the technology disclosed in Japanese Non-examined Patent Publication No.06-139985 (1994) can detect reflected electrons only or both secondary and reflected electrons by means of the energy filter, it can neither detect only secondary electrons which are accelerated by a deceleration field nor detect both secondary and reflected electrons independently and simultaneously without mixture of information specific to secondary and reflected electrons.

The secondary electrons and the reflected electrons respectively have specific information. Therefore, it has been desired to detect these electrons individually to get detailed information on the object to be examined.

A technology for detecting these electrons individually has been disclosed in Japanese Non-examined Patent Publication No.07-192679 (1995). This technology deflects the direction of motion of the secondary electrons by a deflector, separates the secondary electrons from the reflected electrons, and detects the secondary electrons and the reflected electrons individually by corresponding detectors which are placed in the moving passages of the electrons.

However, the above-mentioned technology combined with the retarding technology will allow the secondary electrons to have as high energy as that of the reflected electrons and consequently, their moving tracks become almost the same and they cannot be separated from each other.

As explained above, it is apparent that any conventional technology disclosed in the above patent specifications is hard to detect the secondary electrons and the reflected electrons individually when combined with the retarding technology.

An object of the present invention is to provide a scanning electron microscope (SEM) employing a retarding technology which reduces charge-up of the specimen and accomplishes low chromatic aberration and high resolving power and capable of detecting secondary electrons independently of the other electrons.

The object of the present invention is accomplished by a scanning electron microscope consisting of an electron source, a lens for condensing a primary electron beam emitted from said electron source, detectors for detecting electrons which are generated by radiation of the primary electron beam condensed by said lens onto a specimen, a first decelerating means for decelerating the primary electron beam before the primary electron beam hits said specimen, a second decelerating means for decelerating the electrons generated by collision of electrons against the specimen, and deflectors for deflecting the electrons decelerated by said second decelerating means to said detectors.

The scanning electron microscope of the aforesaid configuration, even when it employs the retarding technology, can selectively detect electrons of lower energies among those generated by radiation of the primary electron beam (e.g. secondary electrons).

DESCRIPTION OF THE PREFERRED EMBODIMENT

The embodiments of the present invention will be explained below in reference with the accompanying drawings. All the embodiments are of a scanning electron microscopes employing a retarding technology to suppress charge-up of a specimen and accomplish low chromatic aberration and high resolving power by forming a deceleration field to decelerate the motion of electrons accelerated by retarding and detecting secondary electrons (signal) decelerated by said deceleration field.

[Embodiment 1]

Figure 1:
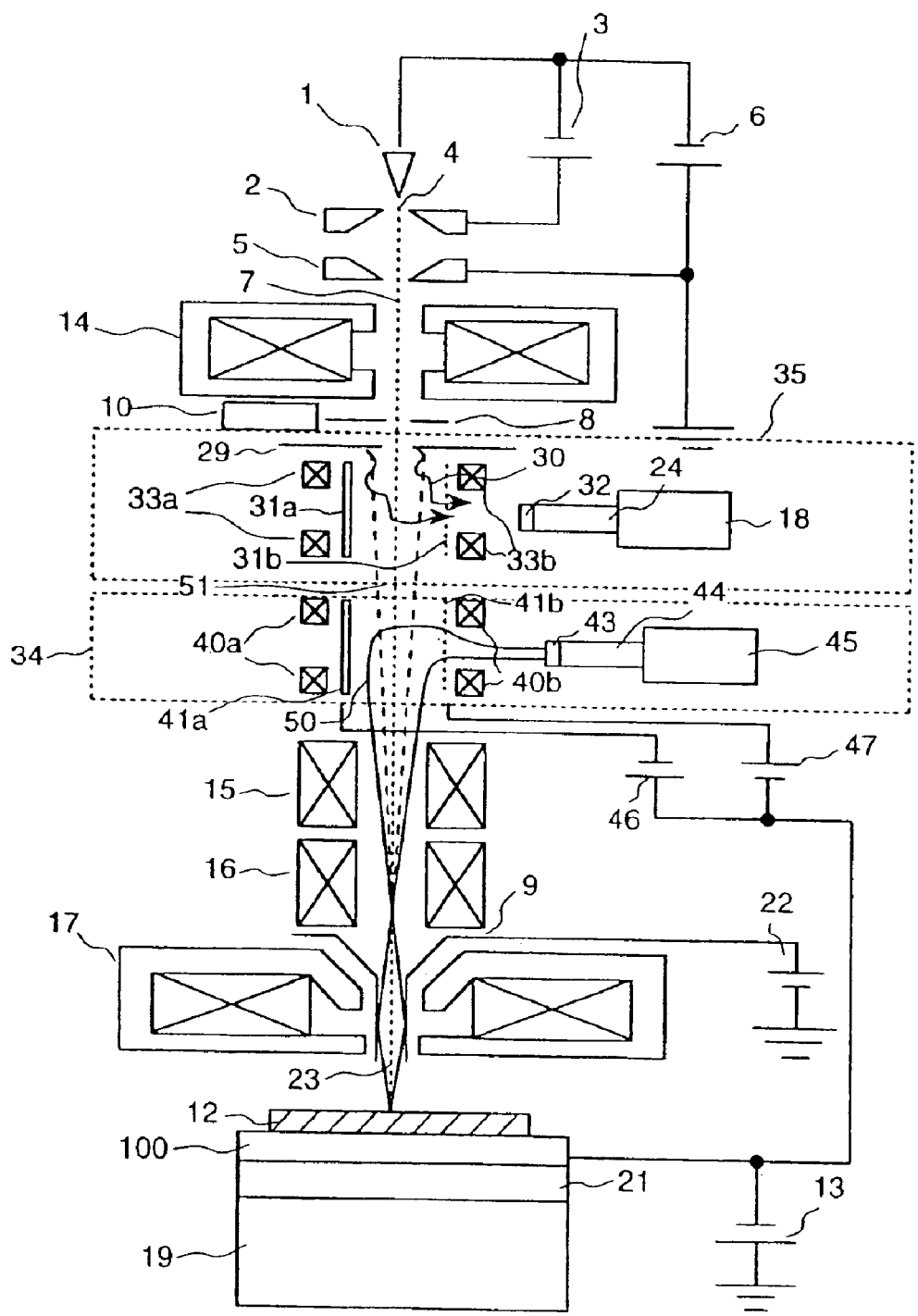
FIG. 1 is a schematic block diagram showing a scanning electron microscope which is an embodiment of the present invention.

FIG. 1 is a schematic block diagram of a scanning electron microscope which is an embodiment of the present invention. When an extraction voltage 3 is applied between an electron source (electron emitting cathode 1) and the extraction electrode 2, electrons 4 are emitted from the cathode 1. The electrons 4 are accelerated (or decelerated in some cases) between the extraction electrode 2 and the anode 5 at the grounding voltage. When passing through the apertures of anode 5, the electron beam (primary electron beam 7) undergoes acceleration by the electron gun acceleration voltage 6.

The primary electron beam 7 accelerated by the anode undergoes scanning deflection by the condenser lens 14, the upper scanning deflector 15 and the lower scanning deflector 16. The upper and lower deflectors work to deflect the electron beam around the center axis of the object lens 17 to scan the object 12 to be examined (a specimen) in a 2-dimensional manner. The deflected primary electron beam 7 further undergoes acceleration by an acceleration voltage 22 from the acceleration tube 9 in the passage of the object lens 17.

The accelerated primary electron beam 7 is finely concentrated onto the specimen 12 by the object lens 17. A deceleration field of a negative voltage (hereinafter called a retarding voltage 13) which is applied via the specimen holder 100 is formed between the object lens 17 and the specimen 12. The primary electron beam 7 passing through the object lens 17 is decelerated in this deceleration field before reaching the specimen 12.

The aperture 8 controls the opening angle of the primary electron beam 7 and it can be center-aligned by the control 10. The mechanism 19 for moving the specimen 12 in the X and Y directions has a specimen holder 100 insulated with an insulating plate 21 on it. A retarding voltage 13 is applied to the specimen holder 100. A specimen (e.g. a wafer) is placed on the holder 100. Naturally, the retarding voltage 13 is also applied to the specimen 12 on the holder.

In this configuration, the acceleration voltage (sum of the electron gun acceleration voltage 6 and the acceleration voltage 22 at the lower stage) applied to the primary electron beam 7 which passes through the object lens 17 is higher than the acceleration voltage applied to the electrons which hit the specimen (=the electron gun acceleration voltage 6 minus the retarding voltage 13). Consequently, this configuration can get a more-concentrated electron beam (of higher resolving power) than a primary electron beam concentrated by the object lens 17.

This is because the chromatic aberration of the object lens 17 reduces. In a typical example applying an electron gun acceleration voltage 6 of 2 kV, an acceleration voltage 22 at the lower stage of 7 kV, and a retarding voltage of 1 kV, the primary electron beam 7 passes through the object lens 17 with a voltage of 9 kV and hits the specimen with an acceleration voltage 13 of 1 kV. The resolving power of this example is 3 nm, which is about on third of that (10 nm) of magnification at the acceleration voltage of 1 kV.

When the primary electron beam 7 irradiates the specimen 12 a secondary signal 23 generates. The secondary signal 23 mainly consists of secondary electrons and reflected electrons.

The electric field formed between the object lens 17 and the specimen 12 works to accelerate the generated secondary signal 23. The secondary signal is attracted into the passage in the object lens 17 and moved up while undergoing the lens action by the magnetic field of the object lens 17. The secondary signal 23 passing through the object lens 17 passes by the scanning deflectors 15 and 16.

In the scanning electron microscope disclosed as an embodiment of the present invention, the secondary signal 23 passing through the scanning deflectors are decelerated by the deceleration electric field formed between the electrostatic deflectors 41a and 41b.

A retarding voltage 13 is applied to the specimen 12 and to a mid-point between the deflection voltages (negative deflection voltage 46 and positive deflection voltage 47) which are applied to these electrostatic deflectors 41a and 41b.

Below will be explained the principle of detection of the secondary signal 23 in this embodiment. This example uses an electron gun acceleration voltage 6 of 2 kV, a acceleration voltage 22 of 7 kV, and a retarding voltage 13 of 1 kV, however these values are intended to explain the invention and are not to be construed to limit the scope of the invention.

The secondary signal 23 generated on the specimen 12 (which consists of secondary electrons whose emission energy is in the range of 0 V to about 10 V and the peak at about 2 V and reflected electrons whose emission energy is 1 kV) is accelerated by the retarding voltage 13 which is applied to the specimen 12 and by the the post acceleration voltage 22. With this, the secondary electrons having energy of 8 kV and the reflected electrons having energy of 9 kV pass through the object lens 17.

After passing by the the post acceleration electrode 9, the secondary signal 23 is decelerated by 7 kV. The secondary electrons are decelerated to have an energy of 1 kV and the reflected electrons are decelerated to have an energy of 2 kV.

As the retarding voltage 13 is applied to a mid-point between the electrostatic deflection electrodes 41a and 41b of the lower detector, the secondary and reflected electrons are further decelerated in the space formed by the electrostatic deflectors 41a and 41b to have the initial energies (0 to about 10 V for the secondary electrons and about 1 kV for the reflected electrons). Namely their energies are decremented by the retarding voltage 13.

The field made by electrostatic deflection electrodes 41a and 41b deflects only the secondary electrons 50 having low energy to make the secondary electrons pass through the electrostatic deflection electrode 41b (wire grid). The secondary electrons hit the scintillator to illuminate it. This illumination is guided by the light guide into the photo-electron multiplier tube 45, converted into an electric signal, and amplified. Only the secondary electrons having lower energy are detected here. The magnetic deflection coils 40a and 40b work to correct the deflection of the primary electron beam 7 by the electrostatic deflection electrodes 41a and 41b.

The reflected electrons 51 still has energy of about 1 kV after they undergo deceleration in the deceleration field formed by the electrostatic deflection electrodes 41a and 41b. Accordingly, the reflected electrons 51 pass by the first detector almost without being deflected in the field made by the electrostatic deflection electrodes 41a and 41b. The reflected electrons 51 further undergo acceleration by the retarding voltage 13, enter the second detector 35 with energy of about 2 kV, and hit the reflecting plate 29. The secondary electrons 30 reflected on the plate 29 are deflected by the electrostatic deflection electrodes 31a and 31b, driven through the electrostatic deflection electrode 31b (wire grid), and detected. The electrostatic deflection electrode 31b is a wire grid through which the deflected secondary electrons can pass. The magnetic deflection coils 33a and 33b generate a magnetic field perpendicular to the electric field generated by the electrostatic deflection electrodes 31a and 31b to cancel the static deflection on the primary electron beam 7. The signal detected here contains information of the reflected electrons 51.

The reflecting plate 29 is a conductive plate having a center aperture through which the primary electron beam 7 can pass. Its surface against which the reflected electrons hit is covered with a material which generates secondary electrons efficiently (e.g. deposited with gold).

The secondary electrons passing through the electrostatic deflection electrode 31b (wire grid) are attracted by the scintillator 32 to which a positive high voltage (10 kV) is applied. Then the secondary electrons hit the scintillator to illuminate it. This illumination is guided by the light guide 24 into the photo-electron multiplier tube 18, converted into an electric signal, and amplified. The output of the photo-electron multiplier tube 18 is used for intensity modulation of the CRT tube (not visible in the drawing).

The aforesaid configuration can detect secondary electrons 50 by the first detector and secondary electrons containing information of the reflected electrons 51 by the second detector 35. The reflected plate 29 can be substituted by a channel plate detector to directly detect electrons reflected on the plate.

The conventional scanning electron microscope having a reflecting plate can detect both reflected and secondary electrons but cannot distinguish secondary electrons from reflected electrons. For example, in a case if creating a sample image by reflected electrons only, the information of the reflected electrons is affected by information of secondary electrons and consequently the image creation fails.

Similarly, the conventional scanning electron microscope having a channel-plate detector can detect reflected electrons only or both secondary electrons and reflected electrons by controlling an energy filter placed between the channel plate and a specimen, but cannot detect the reflected electrons and the secondary electrons individually. For example, to respectively obtain a sample image by reflected electrons and a sample image by secondary electrons, the scanning electron microscope must perform an electron beam scanning to form a reflected electron image and an electron beam scanning to form a secondary electron image (affected by reflected electrons), which reduces the through-put, requires a long-time radiation of an electron beam, and consequently causes charge-up of the specimen.

In some cases, the reflected electrons may cancel a contrast made by secondary electrons. So there has been wanted a scanning electron microscope capable of detecting secondary electrons which are not affected by reflected electrons.

The scanning electron microscope in accordance with the present invention can solve all of the aforesaid problems. Even when a secondary signal is accelerated by the retarding technology, said scanning electron microscope can separate secondary electrons from reflected electrons and detect the reflected electrons only or both the reflected electrons and the secondary electrons simultaneously.

As the reflected electrons has more excellent linearity and permeability than the secondary electrons, the reflected electrons are fit to observe the bottoms of contact holes formed in semiconductor devices.

Further as the reflected electrons can make the image contrast higher, they can be used, for example, to check semiconductor devices for resist residue and to clearly detect an alignment mark whose material is different from semiconductor device materials for exact positioning and alignment.

Meanwhile, the secondary electrons have more signals than the reflected electrons and are fit to observe the fine structure of a contact hole and its vicinity on the sample surface. The scanning electron microscope in accordance with the present invention enables observation of both the bottom and vicinity of a contact hole and can display an image formed by electrons detected by the first detector 34 ("Sample surface image") and an image formed by electrons detected by the second detector 35 ("Contact hole image") on the display unit of the microscope (not visible in the drawing).

Further the scanning electron microscope in accordance with the present invention can combine the reflected electron image and the secondary electron image into a composite image by varying the ratio of signals output from the photo-electron multiplier tubes 18 and 45. In this case, a composite image can be formed from information of the reflected electrons and the secondary electrons which are emitted from an identical object to be examined as the reflected electrons and the secondary electrons can be detected simultaneously. Furthermore, the scanning electron microscope in accordance with the present invention can detect the secondary electrons and the reflected electrons individually, forms their sample images separately, and stores the images in frame memory (not visible in the drawing). So the ratio of the signals can be varied freely. Therefore, the electron beam need not be emitted onto the specimen so long to vary the ratio of signals to compose an image. The images further undergo proper processing into a final image.

However the above examples of explicitly detecting secondary and reflected electrons are intended to explain the invention and are not to be construed to limit the scope of the invention. For example, in the case the retarding voltage applied to the electrostatic deflection electrodes 41a and 41b is made a little lower than the retarding voltage applied to the specimen, a little amount of secondary electrons together with the reflected electrons 51 are caused to hit the reflecting plate 29, converted into secondary electrons and detected by the second detector. In other words, the configuration can be modified to cause the first detector 34 to detect secondary electrons having lower energy (acceleration voltage) and the second detector 35 to detect secondary electrons having higher energy.

In this detecting method, the sample image formed by electrons detected by the second detector 35 contains more information about the reflected electrons than the image formed by electrons detected by the first detector 34. For example, by using the first detector 34 to observe a semiconductor area including contact holes or resist residues and the second detector 35 to observe conductor patterns on a specimen or measure dimensions of patterns, observation modes (Contact Hole mode, Pattern mode, etc.) can be switched without any complicated control.

In the above explanation, this embodiment is assumed to have an acceleration tube 9, but it is apparent that the same effect can be obtained without the tube 9. Similarly, the same effect can be obtained when a retarding voltage 13 is not applied to the sample. Namely, both of provision of the acceleration tube 9 and application of a retarding voltage to a sample are not required to obtain the aforesaid effect. The scanning electron microscope in accordance with the present invention can have provision of the acceleration tube 9, application of a retarding voltage to a sample, or none. Further there have been many other technologies to form a deceleration field. They will be explained below.

[Embodiment 2]

Figure 2:
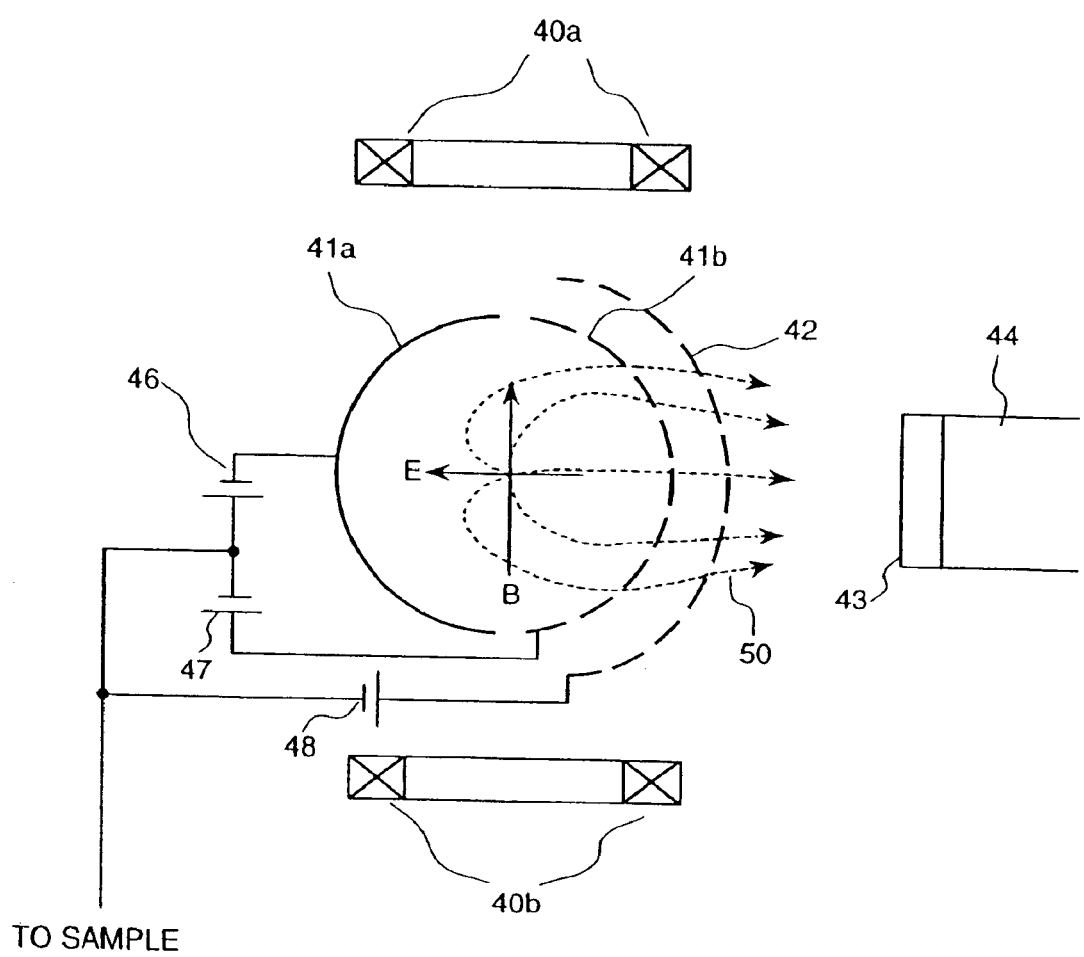
FIG. 2 is a schematic block diagram showing the configuration of the first detector which deflects secondary electrons away from the axis.

FIG. 2 shows the horizontal sectional view of the first detector which is perpendicular to the motion of a primary electron beam. The right half 41b of the cylindrical static deflector 41a and 41b is slitted longitudinally so that the deflected electrons 50 can pass through the right half 41b of the static deflector. The electric field E for deflecting secondary electrons 50 is generated by a negative deflecting voltage 46 and a positive deflecting voltage 47. Usually, these positive and negative deflecting voltages 46 and 47 are of the same magnitude. A retarding voltage is applied to their mid-point.

The deflection coils 40a and 40b produce a deflecting magnetic field B which perpendicularly intersect the electric field E. The magnitude and direction of this magnetic field can be controlled to cancel the deflection of the primary electron beam by the deflection field E.

Contrarily, this magnetic field works to deflect secondary electrons 50 further. A filtering wire grid 42 is placed outside the static deflector 41b along its surface to separate secondary electrons by a difference of emission energies. A filter voltage 48 is applied to separate secondary electrons to the mid-point of the positive and negative deflecting voltages 46 and 47 (to which a retarding voltage is applied).

When a positive voltage is applied to the filtering wire grid 42, the filtering wire grid 42 allows secondary electrons in the whole energy range. When a negative voltage is applied to the filtering wire grid 42, the filtering wire grid repulses secondary electrons of energy equivalent to the negative voltage and lower. The secondary electrons passing through the wire grid 42 are attracted and accelerated by the scintillator 43 to which 10 kV is applied, and hits the scintillator 43 to illuminate. The illumination is guided by the light guide 44.

It is also possible to turn off the retarding voltage 13 which is added to the mid-point of the static deflectors 41a and 41b in FIG. 1 to drive up the secondary electrons and cause the second detector 35 in FIG. 1 to detect both secondary and reflected electrons.

[Embodiment 3]

Figure 3:
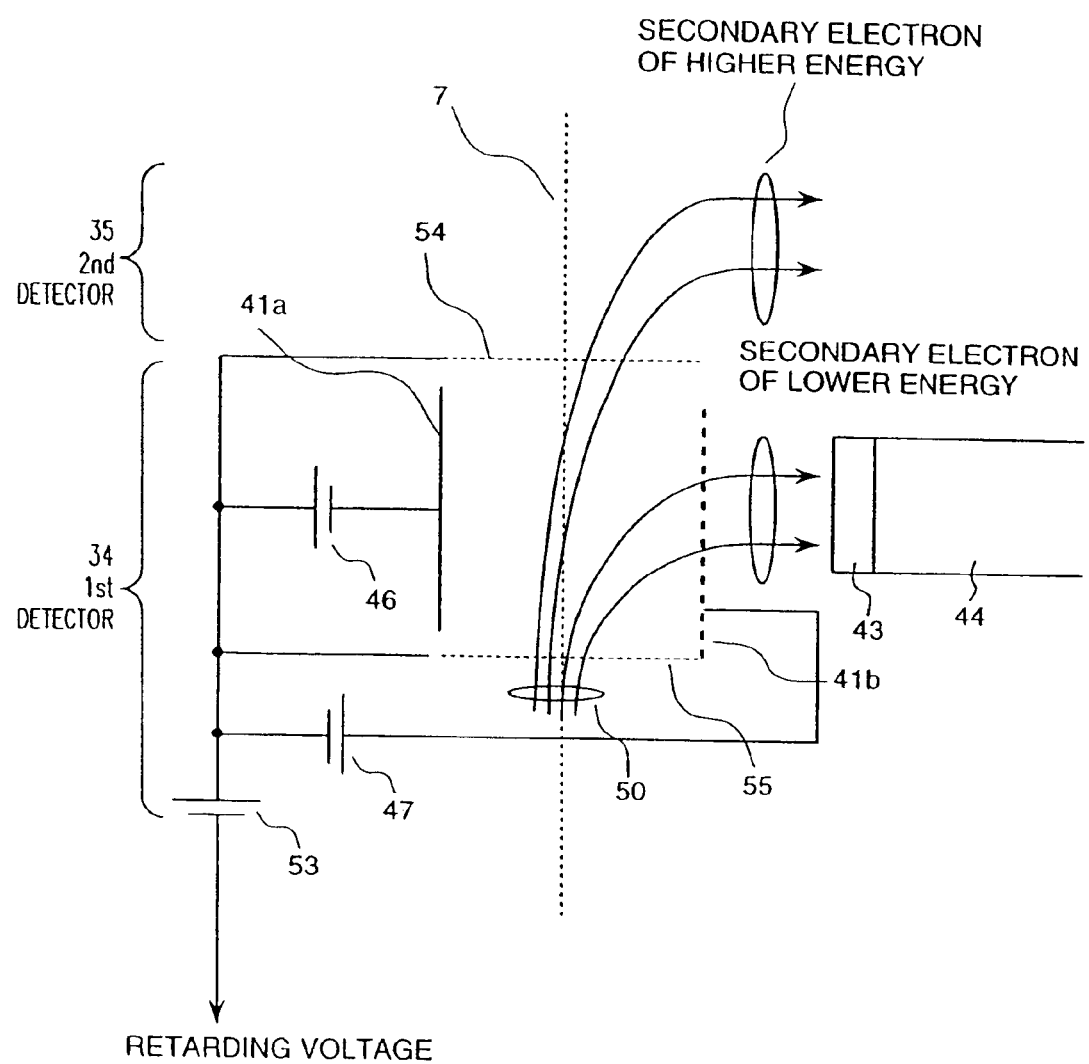
FIG. 3 is a schematic block diagram explaining the configuration which selectively detects secondary electrons of lower energies.

The embodiment of FIG. 1 applies a retarding voltage to the mid-point of the static deflectors 41a and 41b of the first detector 34. It is also possible to selectively detect secondary electrons of a specific energy by adding a voltage to the retarding voltage. Referring to FIG. 3, the principle of the detection will be explained below.

The configuration in FIG. 3 can selectively detect secondary electrons of a lower energy. This configuration has an upper wire grid 54 above the cylindrical static deflector 41a and 41b and a lower wire grid 55 below the static deflectors 41a and 41b. These wire grids 54 and 55 are connected to the mid-point of the deflection voltages 46 and 47 of the static deflectors 41a and 41b. This example applies a positive voltage such as 5 V to a superposition voltage 53.

In this status, the sum of the retarding voltage (negative) and the superposition voltage 53 (positive) is applied to the mid-point of the static deflectors 41a and 41b. This makes secondary electrons in the cylindrical static deflector 41a and. 41b have higher energy (by 5 V) than the secondary electrons in FIG. 2. Therefore, secondary electrons having higher emission energy undergo less deflection and pass by the detector without being detected. As seen from this example, secondary electrons having lower emission energy can be selectively detected by adding a positive voltage to the retarding voltage.

The upper and lower wire grids 54 and 55 in this embodiment can be omitted but the same effect can be obtained. The upper and lower wire grids 54 and 55 respectively have an aperture through which the primary electron beam passes.

When the second detector 35 is placed in the movement of the secondary electrons of higher energy, secondary electrons of lower energy can be detected by the first detector 34 and secondary electrons of higher energy can be detected by the second detector 35. The reflecting plate 29 should be removed to cause the second detector to detect only secondary electrons of higher energy including no reflected electrons. For this purpose, the reflecting plate should be insertable from the outside of the axis of the electron beam according to conditions of measurement. The position of the detector and the provision of the reflecting plate in this embodiment can be set according to specimen compositions and observation modes.

[Embodiment 4]

Figure 4:
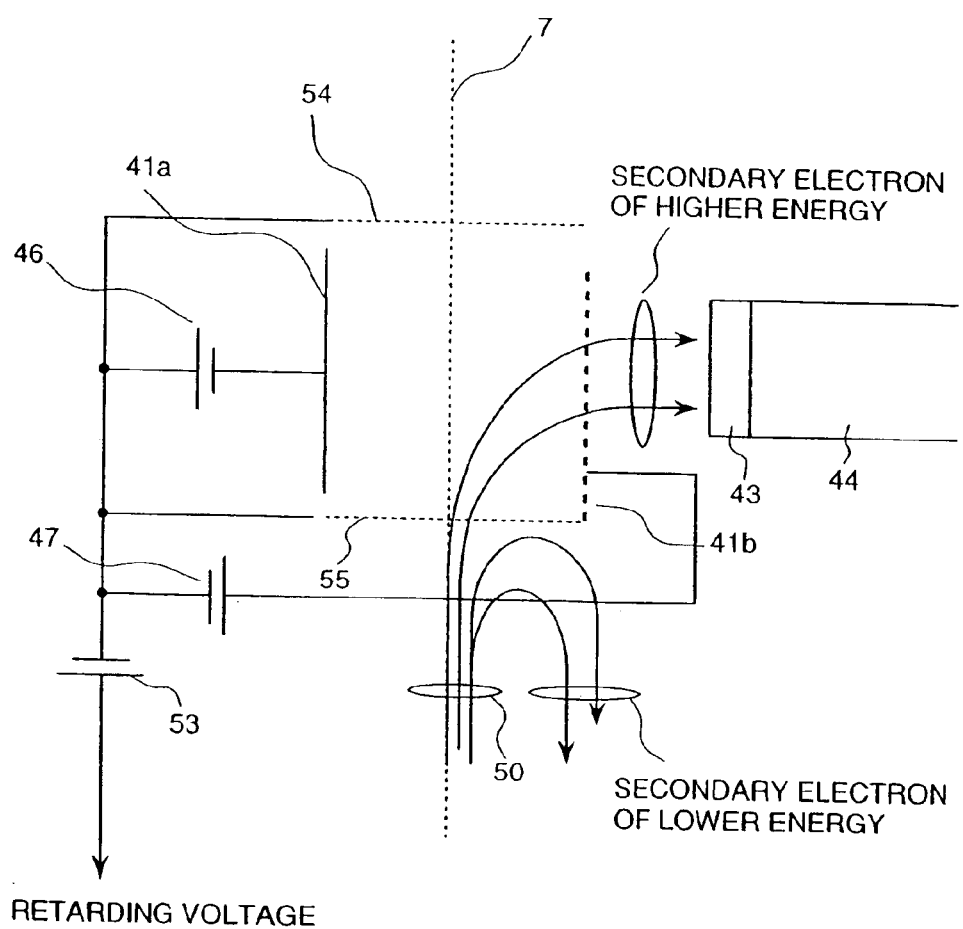
FIG. 4 is a schematic block diagram showing the configuration which selectively detects secondary electrons of lower energies.

FIG. 4 shows an example of selectively detecting secondary electrons of higher energy. FIG. 4 uses a negative superposition voltage 53 (unlike the example in FIG. 3). The negatively-charged lower wire grid 55 repulses secondary electrons of energy equivalent to the negative voltage and lower. Therefore, only the secondary electrons of higher energy that passed through the wire grid 55 can be detected. In this example, (as the second detector 35 equipped with the reflecting plate 29 can detect reflected electrons) the first detector 34 detects secondary electrons of higher energy and the second detector 35 detects reflected electrons.

The scanning electron microscope in accordance with the present invention need not produce a great deflection field because the accelerated secondary electrons are decelerated by a retarding voltage and detected by a detector which is placed away from the beam axis. In this status, secondary electrons can be selectively guided to the static deflection electrode 41b by producing a little potential difference between the electrostatic deflection electrodes 41a and 41b.

This configuration can form a deceleration field between the specimen 24 and the static deflection electrodes 41 and 42 which is as strong as the acceleration field (viewed from the secondary signal) produced between the specimen 24 and the object lens 17. Therefore, the secondary electrons and the reflected electrons which pass through the static deflection electrodes 41 and 42 behave as if retarding is not performed.

It is recommended that the deflection field produced between the static deflection electrodes 41a and 41b should be as weak as possible. If this deflection field is strong, it may deflect not only the secondary signal but also the primary electron beam and consequently it may cause an off-axis aberration.

Although the embodiment of the present invention has a means to produce a magnetic field which perpendicularly intersects the deflection field formed by the static deflector to push back the primary electron beam deflected by the static deflector. (Orthogonal magnetic field generator: disclosed in Japanese Non-examined Patent Publication No.09-171791 (1997)) If the static deflector has a great deflecting force, the energy of the primary electron beam is dispersed and an aberration may occur. Accordingly, it is recommended to make the deflection field as weak as possible even when the orthogonal magnetic field generator is employed.

[Embodiment 5]

Figure 5:
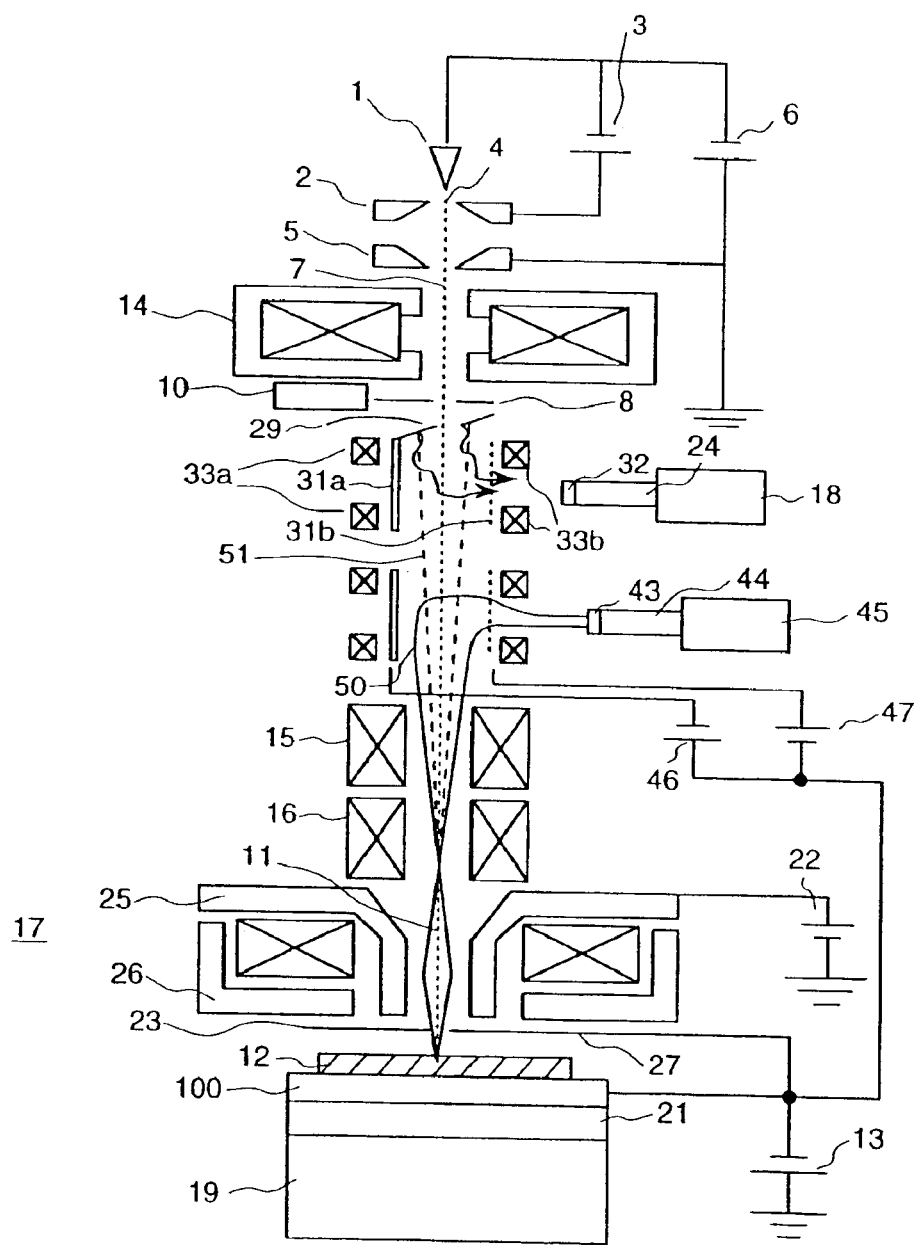
FIG. 5 is a schematic block diagram showing a scanning electron microscope which is another embodiment of the present invention.

FIG. 5 shows the configuration of a scanning electron microscope which is another embodiment of the present invention. In this embodiment, the magnetic path of the object lens 17 is divided into an upper magnetic yoke 25 and a lower magnetic path 26. A lower acceleration voltage 22 is applied to the upper magnetic path and works as a lower acceleration electrode. This configuration reduces a possibility of misalignment of the lower acceleration electrode to the axis of the object lens in comparison to a post acceleration electrode which is provided separately.

This embodiment has a control electrode 27 between the specimen 12 and the object lens 17. A voltage applied to the specimen 12 is also applied to this control electrode 27. This configuration prevents the surface of the insulating specimen from electrically floating in the electric field produced between the specimen 12 and the object lens 17. This control electrode 27 can give the specimen the same voltage as that applied to the specimen holder 100.

The reflecting plate 29 of this embodiment is tilted towards the scintillator 32 to increase the generation of secondary electrons efficiently by the collision of reflected electrons.

[Embodiment 6]

Figure 6:
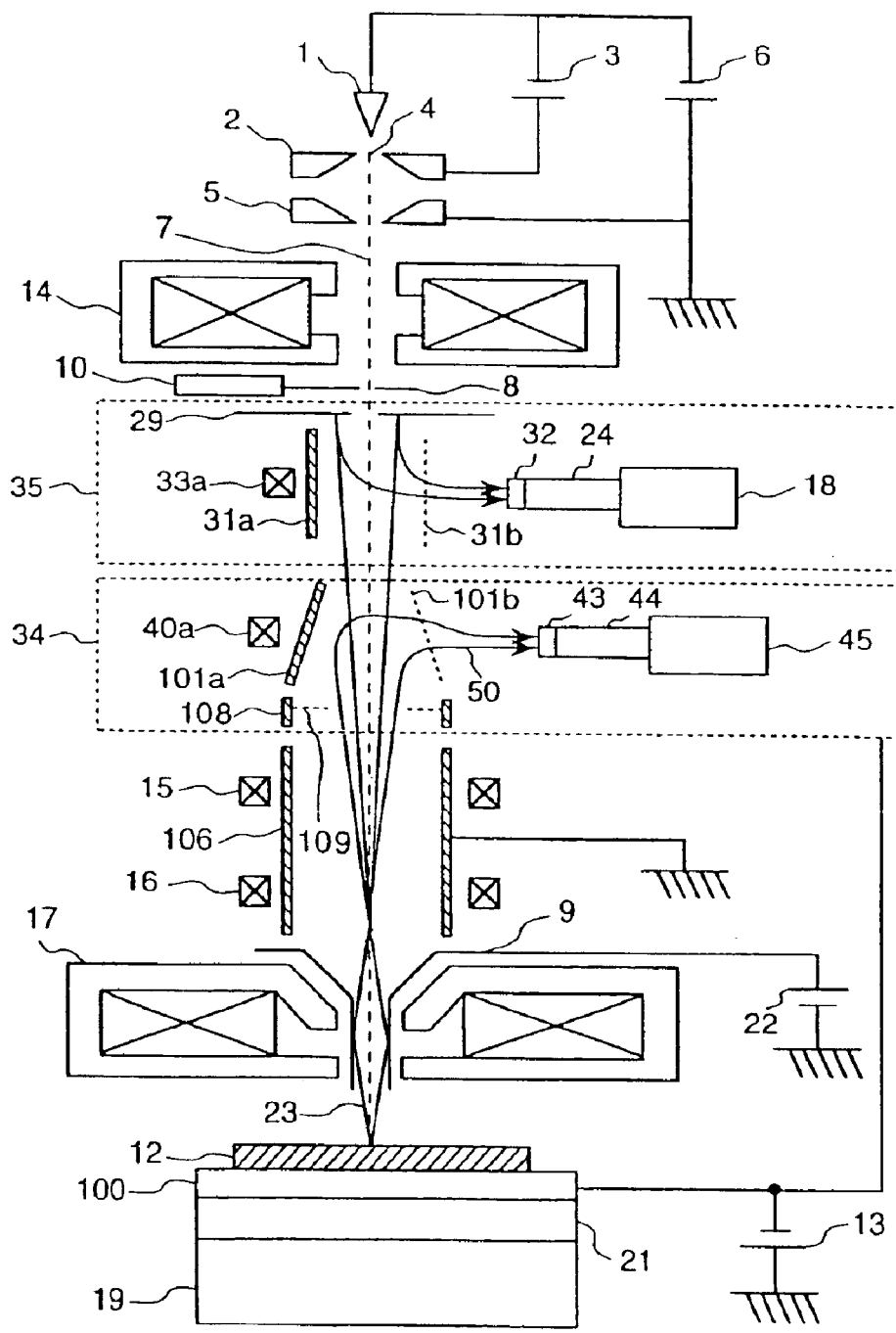
FIG. 6 is a whole schematic block diagram showing a scanning electron microscope which is another embodiment of the present invention.

FIG. 6 shows the configuration of a scanning electron microscope which is another embodiment of the present invention. Component numbers in FIG. 6 are the same as those in FIG. 1 Components of new numbers will be explained below. The liner tube 106 is placed on the inside (on the axis side) of the upper and lower scanning deflectors 15 and 16. The liner tube 106 is grounded to have a ground potential.

This embodiment has static deflection electrodes 101a and 101b instead of the static deflection electrodes 41a and 41b of the first detector 34. The static deflection electrodes 110a and 101b are tapered towards the top. Below will be explained the difference between the static deflection electrodes 101a and 101b of this embodiment and those 41a and 41b of the first embodiment.

Figure 7:
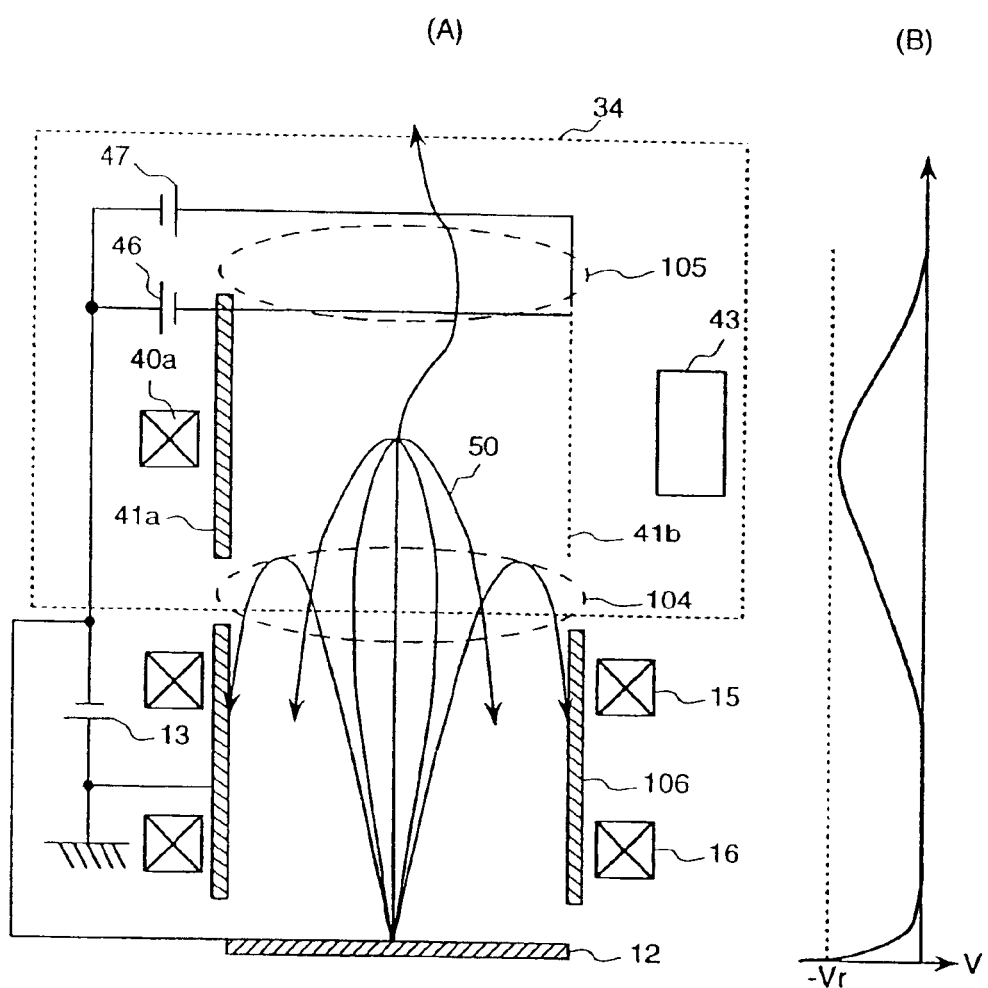
FIG. 7 is a schematic block diagram explaining the principle of detection of secondary electrons in the scanning electron microscope of FIG. 1.

FIG. 7(A) shows the schematic block diagram of the electrostatic deflection electrodes 41 a and 41b and their vicinity in FIG. 1. FIG. 7(B) shows the distribution of potentials along the axis. The secondary electrons 102 which are accelerated by the retarding voltage (not visible in the drawing) applied to the specimen are decelerated in the secondary electron detector 34. A voltage almost equivalent to that applied to the specimen is applied to this secondary electron detecting unit 103 and the secondary electrons 102 are decelerated down to energy of about 10 eV in the acceleration/deceleration area 104.

The decelerated secondary electrons 102 are deflected by the static deflection electrode 41a to which a negative voltage is applied (relative to the specimen voltage) and the static deflection electrode 41b to which a positive voltage is applied. The static deflection electrode 41b is a wire grid through which the deflected secondary electrons 102 can pass through. The magnetic deflection coil 40a produces a magnetic field which perpendicularly intersects an electric field that the static deflection electrodes 41a and 41b produce to cancel deflection of the primary electron beam by the static deflection electrodes.

The secondary electrons 102 passing through the static deflection electrode 41b (wire grid) are attracted to the scintillator 43 to which a positive high voltage (10 kV) is applied and hit the scintillator 43 to illuminate it.

When the retarding voltage 13 is low (e.g. a few hundred voltages or lower), the secondary electrons 102 are efficiently deflected towards the static deflection electrode 41b by a deflection field which is produced by the static deflection electrodes 41a and 41b. When the retarding voltage 13 goes higher (e.g. a few hundred voltages or higher), the deceleration field penetrating into the space between the static deflection electrodes 41a and 41b from the entrance area 104 becomes stronger than the deflection field produced by the static deflection electrodes 41a and 41b and consequently, secondary electrons 102 may be repulsed back towards the specimen 12.

This phenomenon is more striking when the distance between the static deflection electrodes 41a and 41b is made wider (to have a larger diameter) to take in secondary electrons 102 which are deflected much away from the axis of the electron beam by the scanning deflectors 15 and 16.

This kind of field penetration also occurs in the acceleration/deceleration area 105. In some cases, the secondary electrons 102 entering the space between the static deflection electrode 41a and 41b may pass through the deflection area and the acceleration/deceleration area 105/104.

Figure 8:
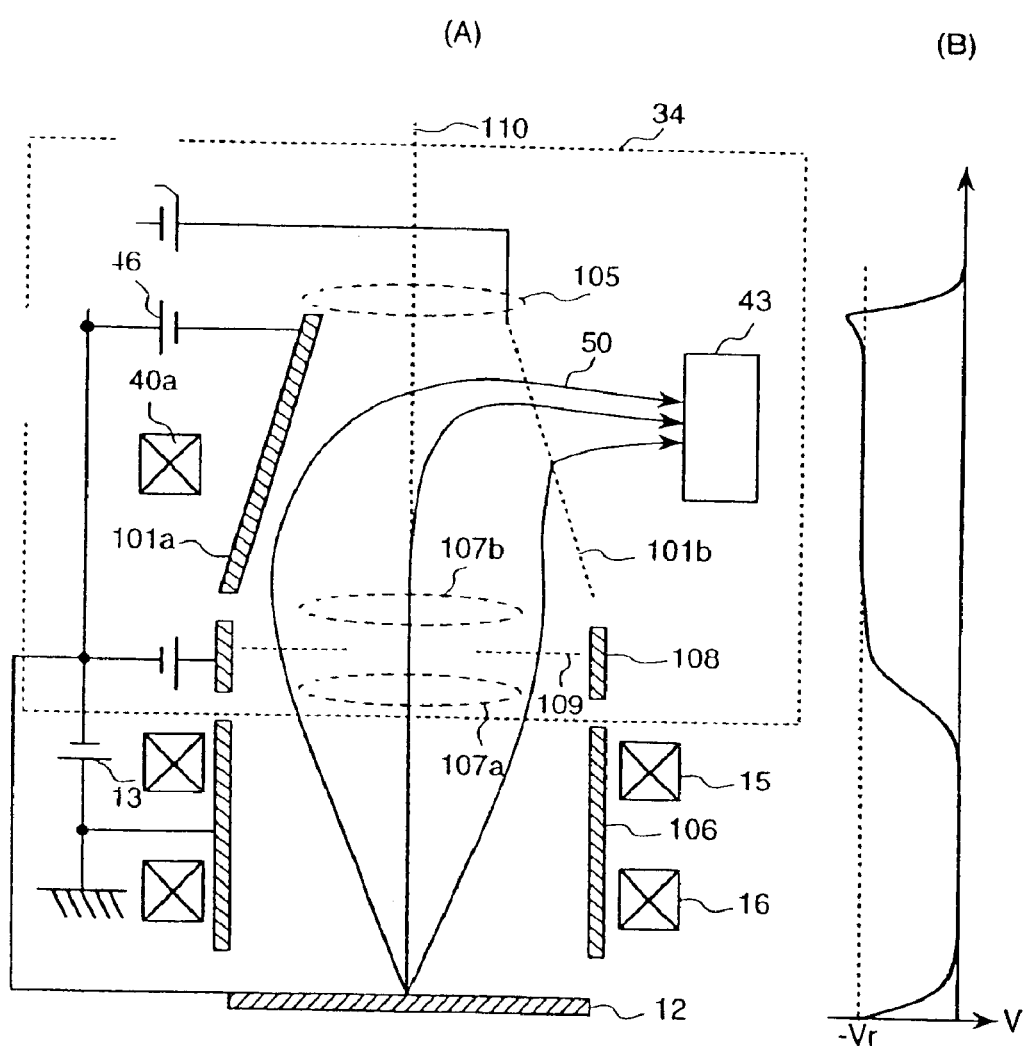
FIG. 8 is a schematic block diagram explaining the principle of detection of secondary electrons in the scanning electron microscope of FIG. 6.

To solve the aforesaid problems, this embodiment has static deflection electrodes 110a and 101b which are tapered towards the source of electrons. FIG. 8 shows the details of the static deflection electrodes. FIG. 8(A) shows the schematic block diagram of the static deflection electrodes 101a and 101b which are tapered towards the source of electrons and their vicinity. FIG. 8(B) shows the distribution of potentials along the axis.

The lower ends of the static deflection electrodes 101a and 101b which produce a traverse electric field are wide-spaced to catch secondary electrons 102 which move further away from the axis of the electron beam. The upper parts of the static deflection electrodes 101a and 101b are made narrower and the resulting deflection field becomes stronger than that of the lower half of the static deflection electrodes 101a and 101b. The secondary electrons 102 taken into the space of the static deflection electrodes 101a and 101b are efficiently deflected towards the static deflection electrode 101b by the comparatively strong deflection field produced by the upper half of the static deflection electrodes 101a and 101b.

This electrode configuration enables capture of almost all secondary electrons including those going further away from the axis of the electron beam and high-efficient deflection of the captured electrons to the detector.

As already explained, the potential of the area which deflects secondary electrons is approximately equal to the potential of the specimen. This potential causes the acceleration/deceleration areas 107 (entrance) and 105 (exit) to produce a strong deceleration field and a strong acceleration field respectively. If these strong electric fields invade the deflection space formed by the static deflection electrodes 101a and 101b, they may repulse the secondary electrons back to the specimen as already explained. To prevent this problem (or to reduce the influence of the electric field upon the space formed by the static deflection electrodes 101a and 101b), the embodiment of the present invention has an intermediate deceleration electrode 108 whose voltage can be controlled independently of the retarding voltage and the boosting voltage in the acceleration/deceleration area 107.

This intermediate deceleration electrode 108 decelerates the secondary electrons 102 coming from the specimen in multiple stages (2 stages 107a and 107b in this embodiment). Therefore, this intermediate deceleration electrode 108 can reduce the influence of the electric field upon the space formed by the static deflection electrodes 110a and 101b.

Further, a grid 109 on an intermediate deceleration electrode 108 can control penetration of the deceleration field more effectively. The grid 109 has an aperture in the center (where the axis of the electron beam intersects) to allow the primary electron beam 110 to pass through.

In the above explanation, the embodiment has the static deflection electrodes 101a and 101b which are tapered towards the source of electrons. This electrode structure can be substituted by a tapered cone-like electrodes which are splitted longitudinally or a unit consisting of two flat electrode plates which come close to each other as they go up to the source of the electrons. Further the number of such electrodes can be two or more.

The liner tube 106 need not always be in the ground potential level. For example, it can be used as an acceleration cylinder. However, this embodiment grounds the liner tube 106 to control penetration of the deceleration field into the deflection area.

[Embodiment 7]

Figure 9:
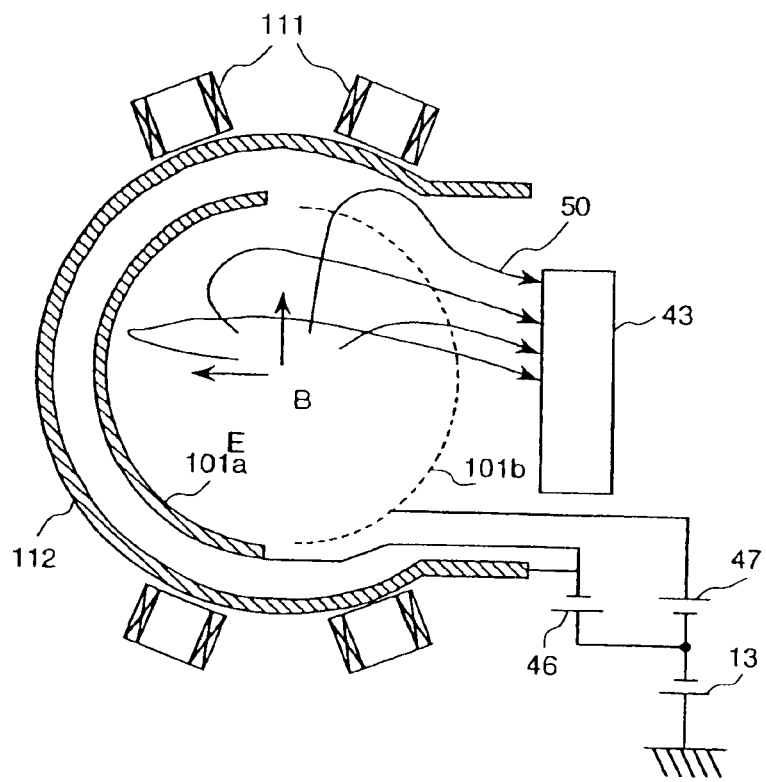
FIG. 9 is a horizontal sectional view of the secondary electron beam detector of a scanning electron microscope which is an embodiment of the present invention, explaining the structure of an electrode for deflecting secondary electrons towards the scintillator.

FIG. 9 shows the horizontal sectional view of the secondary electron detector which is perpendicular to the motion of a primary electron beam. The static deflection electrodes 101a and 101b are constructed to form a circular truncated cone whose side surface is splitted along the slant (which is not visible in the drawing). The static deflection electrode 101b is made in a grid form to let secondary electrons pass through it.

The electric field E for deflecting secondary electrons 102 is produced by the negative deflection voltage 46 and the positive deflection voltage 47 which is increased by the retarding voltage 13. The magnitude and direction of this magnetic field can be controlled to cancel the deflection of the primary electron beam by the deflection field E. This magnetic field works to deflect secondary electrons 102 further.

The deflection coil 111 consists of four coil elements which are controlled independently to control the direction and strength of deflection by the deflection magnetic field B. This configuration can correct the perpendicularity of the electric field E to the magnetic field B.

The static deflection electrodes 101a and 101b are surrounded by a reflective wall electrode 112 to guide the secondary electrons 102 which comes through the grid of the static deflection electrode 101b to the scintillator 43.

The reflective wall electrode 112 and the static deflection electrode 101a can be built in a body as these electrodes can be in the same potential. The secondary electrons 102 passing through the static deflection electrode 101b are attracted to the scintillator 43 to which 10 kV is applied, accelerated and finally hit the scintillator 43 to illuminate.

[Embodiment 8]

Figure 10:
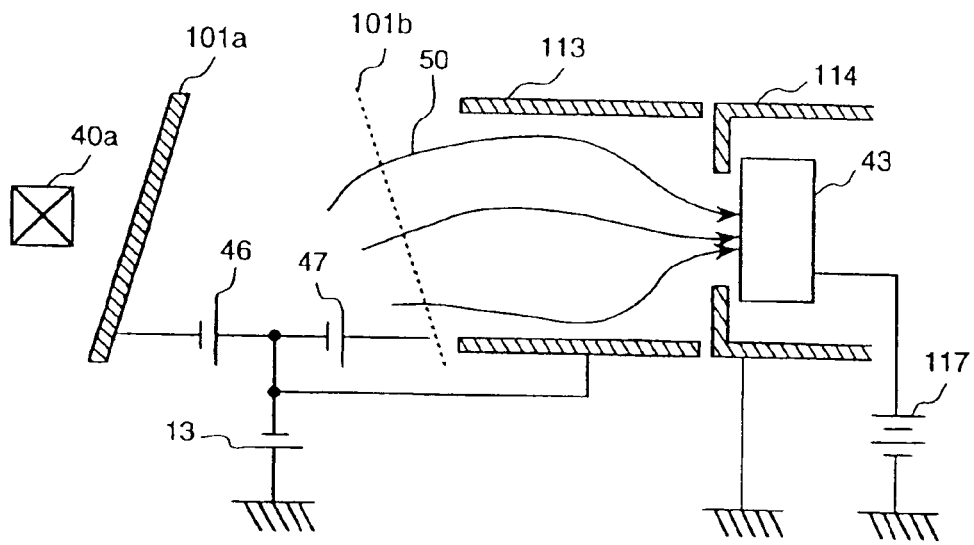
FIG. 10 is a vertical sectional view of the secondary electron beam detector of a scanning electron microscope which is an embodiment of the present invention, explaining the structure of an electrode for concentrating secondary electrons to the center of the scintillator.
Figure 11:
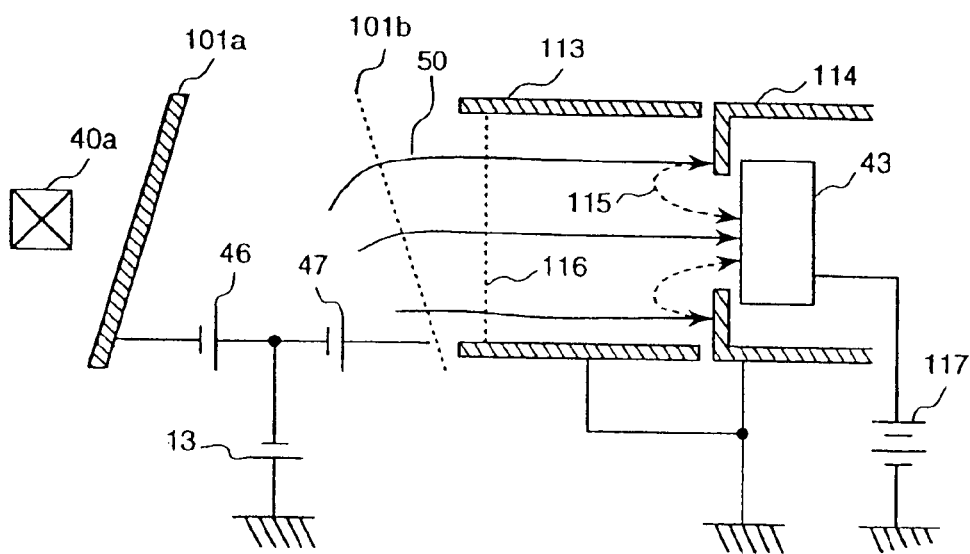
FIG. 11 is another vertical sectional view of the secondary electron beam detector of a scanning electron microscope which is an embodiment of the present invention, explaining the structure of an electrode for concentrating secondary electrons to the center of the scintillator.

FIG. 10 and FIG. 11 show how the secondary electrons 102 passing through the static deflection electrode 101b are guided to the scintillator 43 by the cylindrical electrode 113 for collecting secondary electrons. To deflect secondary electrons 102 coming through the whole grid of the static deflection electrode 101b efficiently to the scintillator which has a narrower effective area than the wire grid, the cylindrical electrode 113 for collecting secondary electrons is used.

FIG. 10 shows a method of concentrating the secondary electrons 102 passing through the static deflection electrode 101b directly towards the scintillator 43. When a retarding voltage 13 is applied to the cylindrical electrode 113, the secondary electrons 102 undergo acceleration by an acceleration electric field of the grounded outer cylinder 114 of the scintillator 43 and jump into the scintillator 43 which is placed in the center of the cylindrical electrode 113.

Meanwhile, FIG. 11 shows a method of accelerating the secondary electrons 102 passing through the static deflection electrode 101b to move straight on. The accelerated secondary electrons hit the inner surface of the cylindrical electrode 113 or the outer cylinder 114 of the scintillator 43 and generate new secondary electrons 115.

A wire grid 116 attached to the opening of the cylindrical electrode 113 which is faced to the static deflection electrode 101b prevents the electric field produced by the static deflection electrode 101b from invading the inside of the cylindrical electrode 113. This causes the capturing electric field from the scintillator 43 to which a voltage 117 of about 10 kV is applied to penetrate into the cylindrical electrode 113. As the result, secondary electrons 115 are captured by the scintillator 43 efficiently.

[Embodiment 9]

Figure 12:
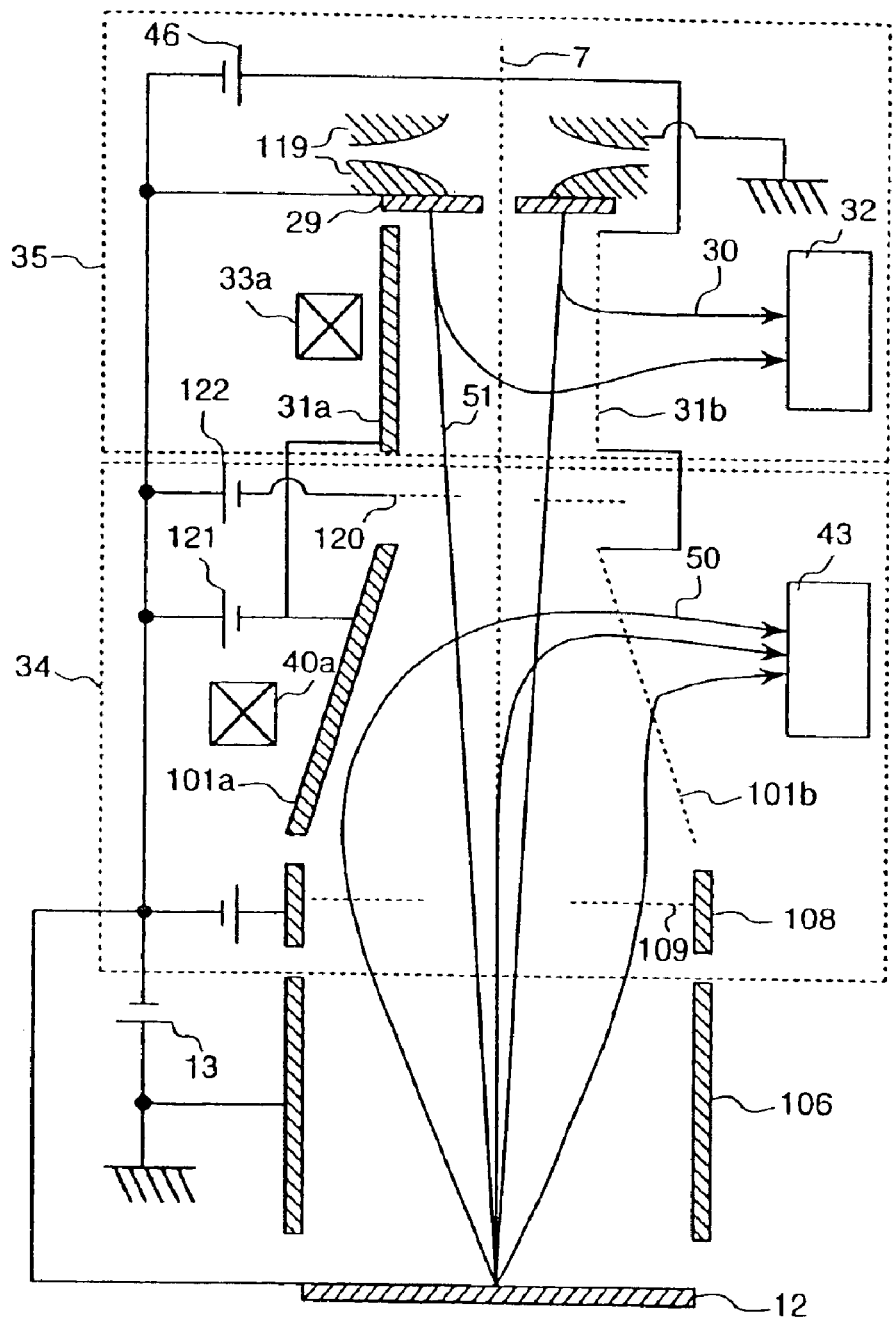
FIG. 12 is a schematic block diagram of the second signal detector which uses a Butler type electrode in the area to decelerate primary electrons.

FIG. 12 shows an embodiment which applies a retarding voltage 13 to both a detector 34 for detecting secondary electrons and a unit detector 35 for detecting reflected electrons. The primary electron beam 7 undergoes deceleration on passing through the Butler type deceleration lens 119, goes through the reflected electron detector 35 and the secondary electron detector 34, and undergoes acceleration in the space of the deceleration electrode 108.

As the retarding voltage 13 (1 kV) is comparatively great relative to the acceleration voltage of the electron gun (2 kV) and the reflecting plate 29 has a very small opening (about 1 mm in diameter) to let the primary electron beam 7 pass through, an aberration is apt to generate and consequently the diameter of the primary electron beam may increase. However the Butler type deceleration lens, when installed, can decelerate the primary electron beam while suppressing the generation of an aberration. The reflected electron detector 35 and the secondary electron detector 34 are isolated from each other by a wire grid electrode 120. A negative voltage 122 which is higher by a few ten volts than the deflection electrode voltage 121 is applied to the wire grid electrode 120, which prevents the secondary electrons 102 from going into the reflected electron detector 35. This also prevents the secondary electrons 30 reflected by the reflecting plate 29 from going into the secondary electron detector 34.

After passing through the grid-like static deflection electrode 101b by the deflection force produced by the static deflection electrodes 101a and 101b, the secondary electrons 102 are attracted to the scintillator 43 to which a positive high voltage of 10 kV is applied and hit the scintillator 43 to illuminate. The light of illumination is guided by the light guide into the photo-electron multiplier 45, converted into an electric signal and amplified there. This output is used to perform the brightness modulation of a CRT tube (not visible in the drawing). Meanwhile, the reflected electron detector 118 causes the reflected electrons 51 passing through the secondary electron detector 34 to be reflected by the reflecting plate 29 and guides to the scintillator 32. In other words, when the reflected electrons 51 hit the reflecting plate 29, new secondary electrons 30 come out from the reflecting plate, undergo deflection by the deflection field produced by the static deflection electrodes 31a and 31b, and pass through the wire grid of the static deflection electrode 31b. The succeeding operation of the reflected electron detector 35 is the same as that of the secondary electron detector 34.

[Embodiment 10]

A charge-up of a specimen in observation through an electron microscope disturbs the motion of secondary and reflected electrons from the specimen and consequently causes extraordinary contrasts and distortions in the obtained images.

Although the retarding technology suppresses charge-up of a specimen by using primary electron beams of low energy, the specimen cannot be free from being charged up as the low energy of the primary electron beam is strong enough to charge up the specimen.

The scanning electron microscope in accordance with the present invention has a function to apply a voltage to eliminate the charge of the specimen. The detailed means will be explained below.

The present invention will be more clearly understood with reference to a configuration of a scanning electron microscope which does not use the principle of this embodiment.

The explanation below assumes that the low-acceleration scanning electron microscope will observe a semiconductor specimen having a resist or silicon oxide film pattern on an insulation layer formed on a silicon wafer. In this case, the specimen is charged up. This charge is steady at a certain positive voltage depending upon an acceleration voltage or the like without changing as the time goes by. However, this positive voltage value is not known.

For example, the positive voltage on a resist pattern formed on a silicon wafer is about a few voltages, but the positive voltage on a resist pattern on a silicon oxide layer formed on a silicon wafer is higher than 10 V. If the latter specimen is observed by a scanning electron microscope of FIG. 1, it sometimes happens that the first detector 34 detects no signal or less signals than expected. This problem not only reduces the signals but also changes the magnification of a scanning image. In semiconductor processes, exact measurement of dimensions of patterns on semiconductor wafers is very significant and dimensional errors due to charge-up of specimens cannot be ignored.

Figure 13:
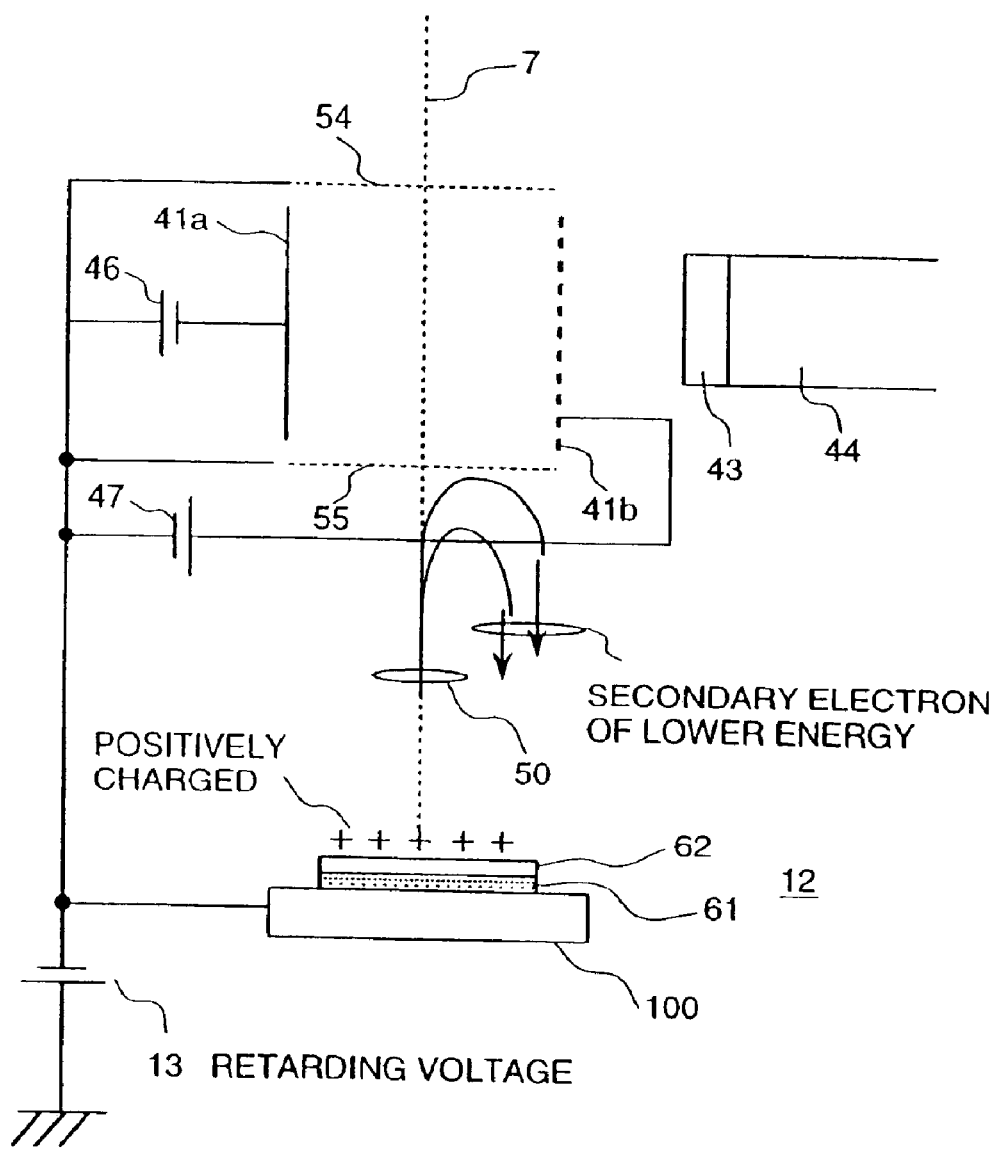
FIG. 13 is a schematic block diagram explaining how the charge-up of a specimen causes a problem (detection of no secondary electrons).

Referring to FIG. 13, this problem will be explained in detail. FIG. 13 contains only the specimen section 12 and the first detector section 34 that are required for explanation. Components that are also found in FIG. 1 will not be explained here.

The specimen 12 contains a pattern 62 of insulating material formed on a silicone wafer 61. This pattern 62 is positively charged by exposure to the primary electron beam 7. The magnitude (in voltages) of this charge-up is dependent upon the energy of the primary electron beam 7 applied to the specimen 12.

The first detector 34 has a wire grid 55 to which a retarding voltage 13 is applied at its entrance. The secondary electrons 50 emitted from the specimen 12 at the same potential as the retarding voltage 53 can go into the first detector 34 but the positively-charged secondary electrons 50 are repulsed by the wire grid 55 and cannot get to the first detector 34.

Figure 14:
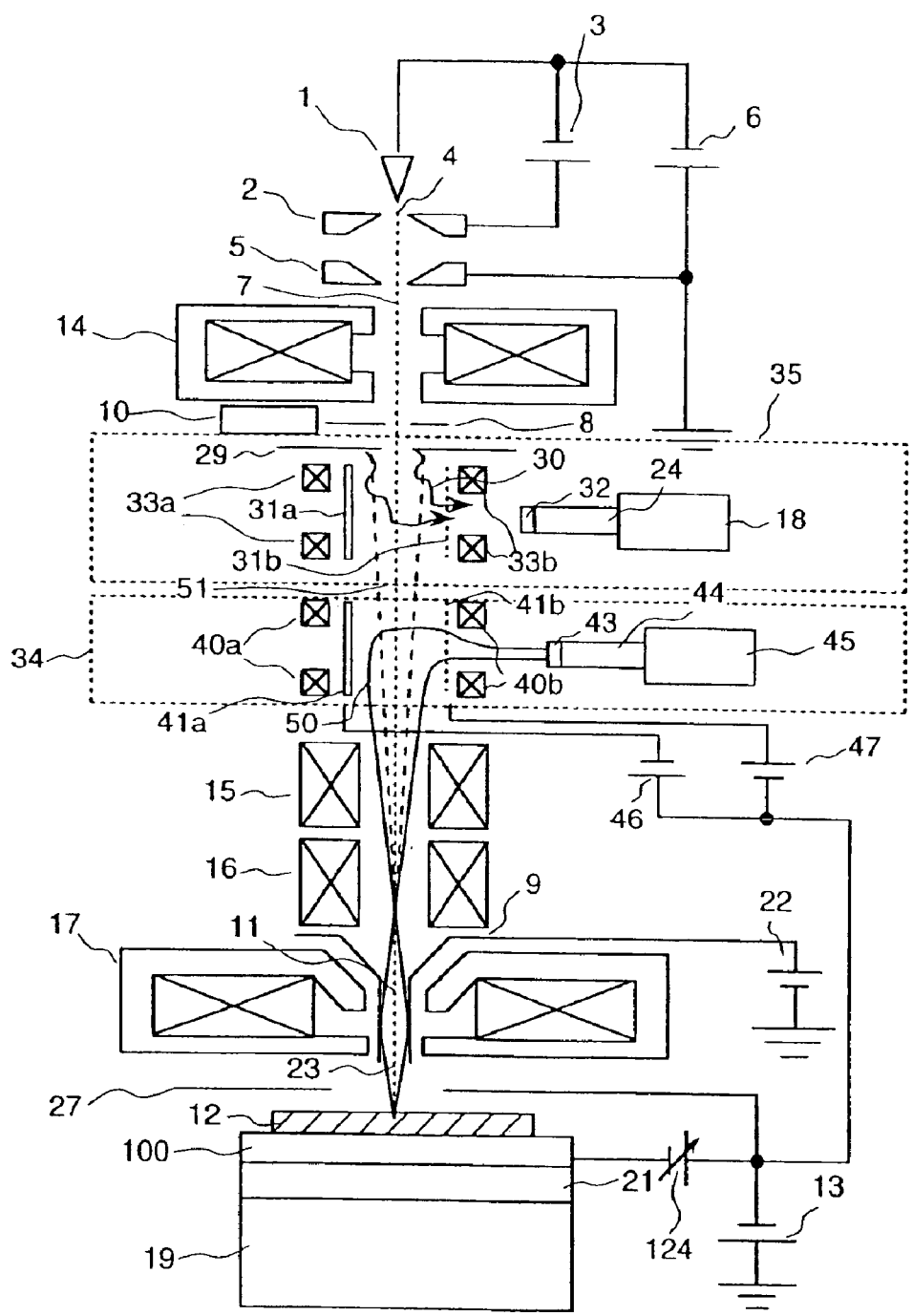
FIG. 14 is a schematic block diagram showing a low acceleration voltage scanning electron microscope in accordance with the present invention which employs the retarding technology and acceleration at a lower stage.

FIG. 14 shows the configuration of an embodiment of the present invention to solve such a problem. FIG. 1 and FIG. 14 are the same except that FIG. 14 has a surface voltage correcting voltage source 124 (means for applying a variable voltage) between the specimen and the retarding voltage 53.

Figure 15:
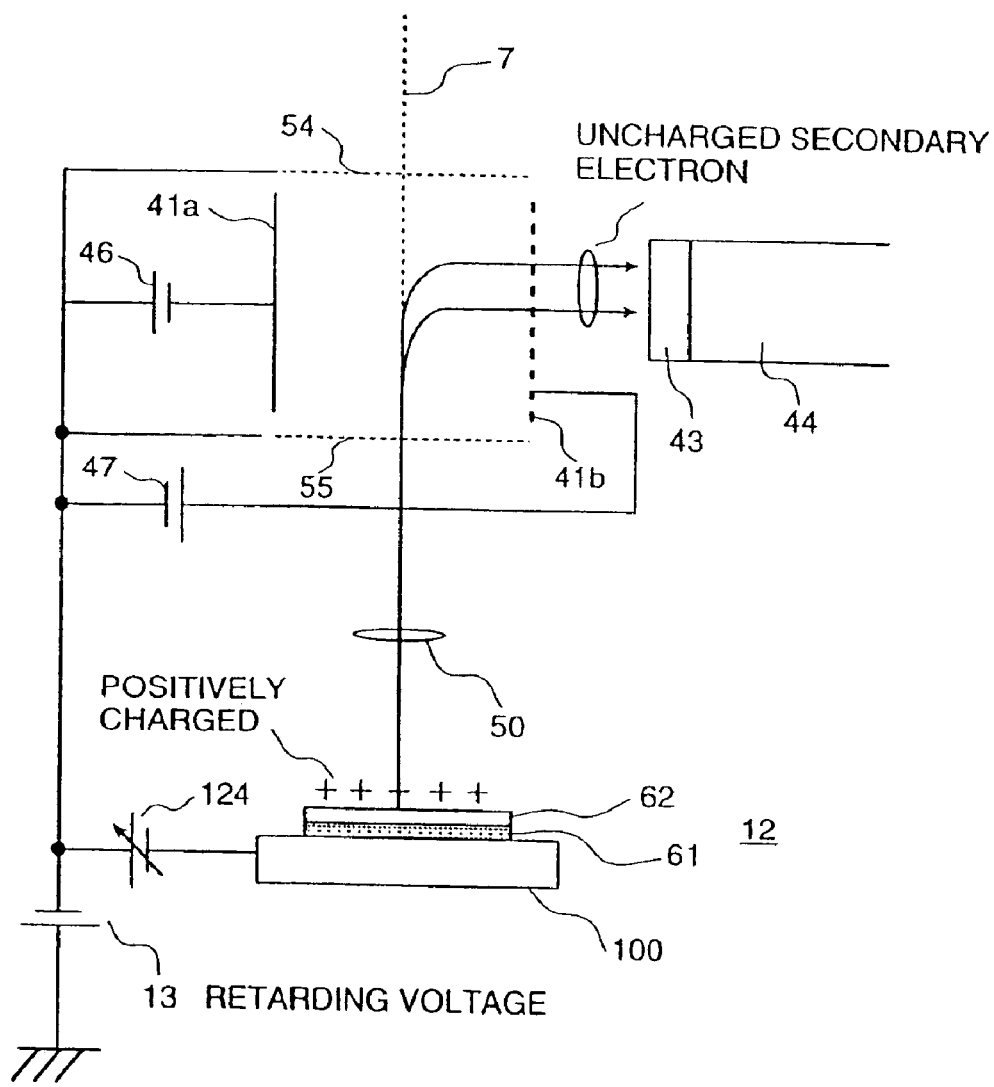
FIG. 15 is a schematic block diagram explaining a method of solving a problem of FIG. 13 by a surface correction voltage.

As disclosed in FIG. 15, the surface voltage correcting voltage source 63 provided between the specimen 12 and the retarding voltage 53 is controlled to apply such a voltage that eliminates the charge of the specimen 12. With this, an optimum image is obtained.

The operator can manually control this voltage while observing the obtained image on the monitor screen (of the CRT or the like). It is very hard to know how much the specimen is charged singly from the obtained specimen image, but the contrast of the obtained specimen image varies depending upon the quantity of secondary electrons detected by the detector. Therefore, the operator has only to control the surface correction voltage to get a specimen image of the optimum contrast.

When a specimen 12 covered with an insulating film is observed by a scanning electron microscope, the first detector 34 may fail to detect a signal due to the charge-up of the specimen. Contrarily, the second detector 35 can observe the specimen image independently of whether or not the specimen is charged up as the detector 35 detects the reflected electrons. Accordingly, the second detector 35 can be used to check the location of a specimen to be examined.

[Embodiment 11]

Below will be explained another example to set a surface voltage correcting voltage 124. The first step of this method is to gradually increase the correction voltage 124 while monitoring the output of the secondary electron multiplier tube 45. A multiplying voltage for optimum observation should be applied to the secondary electron multiplier tube 45.

Figure 16:
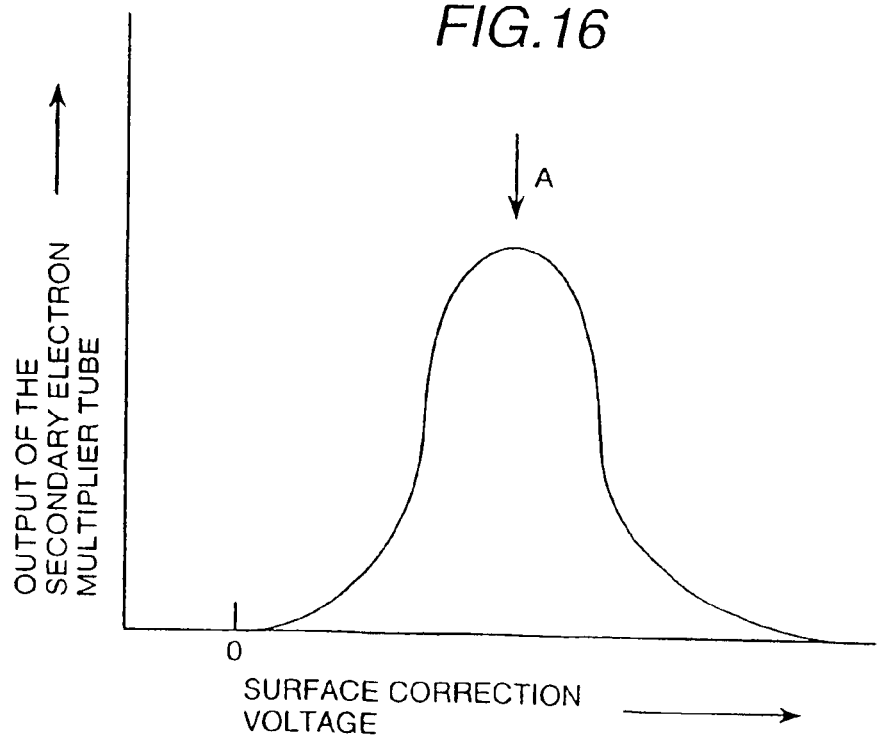
FIG. 16 is a graph showing the relationship between the surface correction voltage and the output of the secondary electron multiplier tube.

FIG. 16 shows the relationship between the correction voltage 124 obtained by this operation and the output of the secondary electron multiplier tube 45. This graph indicates that the greatest output can be obtained when the correction voltage 124 is equal to the charge-up voltage of the specimen 12 (pointed to by arrow A). Substantially, data of this graph is stored in memory of a control computer and used to set the optimum correction voltage (pointed to by arrow A). This setting is required just after specimens 12 are changed and not required as far as an identical wafer is observed. However, this setting is required when acceleration voltages or magnitudes of the primary electron beam are changed.

Although the above embodiment applies a multiplying voltage for optimum observation to the secondary electron multiplier tube 45, this voltage is controlled manually or automatically by an automatic circuit to get a sensitivity at which images of optimum contrast and brightness can be obtained in actual observation.

It is recommended to provide a level gauge and the like which indicates the output of the secondary electron multiplier tube 45 to control the surface voltage correcting voltage source. With the help of this level gauge, the operator can select an optimum correction voltage by adjusting the voltage source while monitoring the level gauge.

Figure 17:
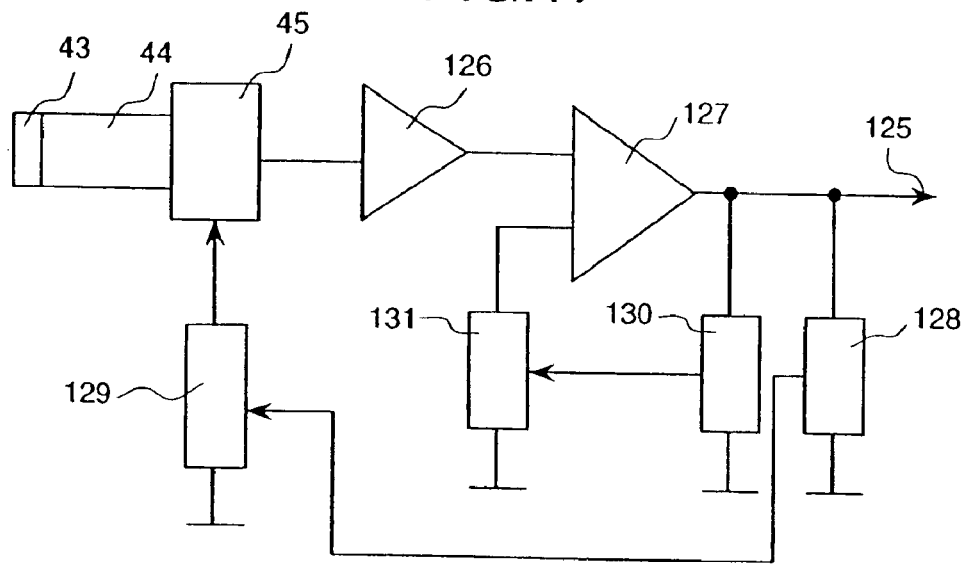
FIG. 17 is a schematic diagram explaining a circuit which automatically controls the intensity and the amplitude of the output of the secondary electron multiplier tube.

FIG. 17 shows a block diagram of a circuit which automatically adjusts a multiplication voltage given to the secondary electron multiplier tube.

This circuit changes the DC voltage and adjusts the multiplication voltage to get a preset average output 125 (brightness) and a preset image amplitude (contrast of the scanning image). The output of the secondary electron multiplier tube 45 is amplified by the pre-amplifier 126 and fed to the main amplifier 127. The amplitude of the output 125 of the main amplifier 127 is detected by the amplitude detecting circuit 128 and controls the amplification voltage 129 to get a preset amplitude. The mean signal value is detected by the mean value detecting circuit 130 and controlled by the DC adjusting circuit 131 of the main amplifier 127.

It is needless to say that there are some brightness and amplitude values to be selected. The above circuit outputs a maximum multiplier voltage (limit of the power designing) when no secondary electron is entered. This circuit outputs less multiplier voltage as the secondary electron input increases.

Figure 18:
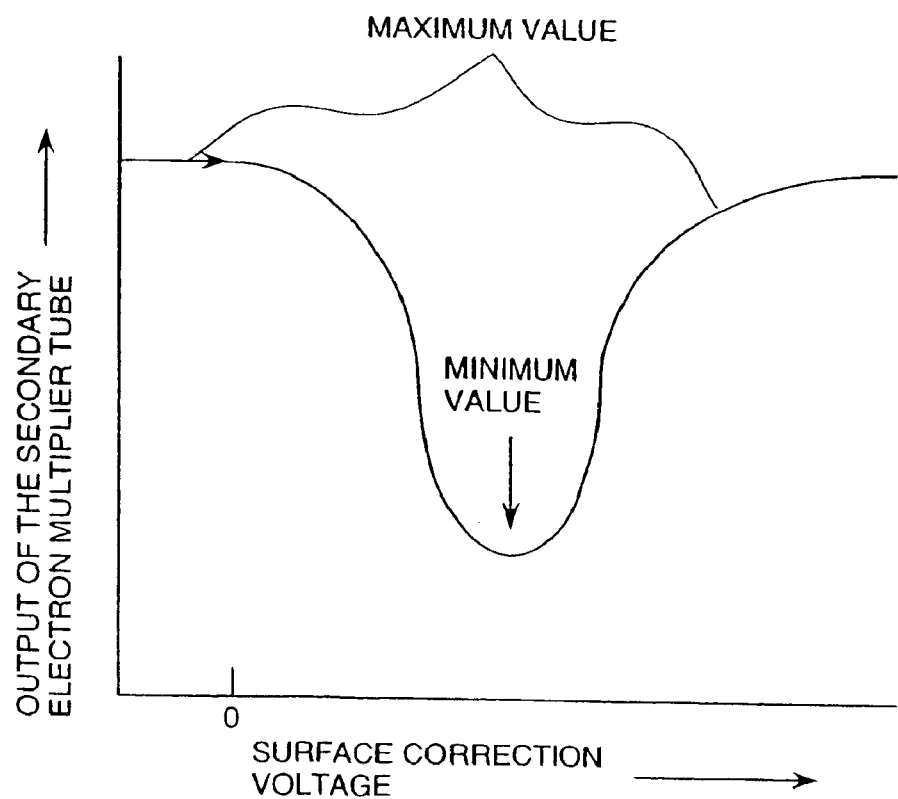
FIG. 18 is a graph showing the relationship between the surface correction voltage and the output of the secondary electron multiplier tube when the scanning electron microscope has a circuit of FIG. 17.

FIG. 18 shows the relationship between the surface-voltage correcting voltage 124 and the amplification voltage 129 when the circuit of FIG. 17 is used for the second detector 35 of FIG. 14. The multiplier voltage 129 becomes minimum at a correction voltage 124 pointed to by an arrow. The secondary electron input becomes maximum at this correction voltage 124. This method has a merit of performing determination of an adjusting voltage and adjustment of brightness and contrast simultaneously.

As already explained, determination of an adjustment voltage is required not only for high-efficiency detection of secondary electrons but also for determination of energy (acceleration voltage) applied to the specimen, and further for determination of a magnification.

Further scanning electron microscopes have been used for measurement of dimensions of processed parts of semiconductors. This measurement requires a high precision of 1% or less. For example in the aforesaid example, let's assume that the specimen surface is charged at 30 V when the primary electron beam of 2 kV undergoes deceleration by the retarding voltage of 1.2 kV and hits a specimen with energy of 800 V. In this case, the magnification change is 3.7%, which is a problem. However, the method in accordance with the present invention can suppress the magnification change under 1% (0.6) as it can select an optimum value at a precision of 5 V or less.

[Embodiment 12]

The example shown in FIG. 5 performs retarding by applying a retarding voltage to the specimen holder 100 and to the control electrode 27. This configuration forms a potential area having the same voltage as the retarding voltage between the specimen holder 100 and the control electrode 27. This seems that the retarding voltage is applied to the specimen 12 in the epuipotential area.

This method is effective for observation of specimens 12 whose surface is coated with an insulating layer. This method applies a retarding voltage to such a specimen to cancel the charge. To observe a specimen whose surface is not coated with an insulating layer, a means is effective to apply a negative voltage to the specimen rest of the specimen holder 100. Below are explained some other means to form a deceleration field.

Figure 19:
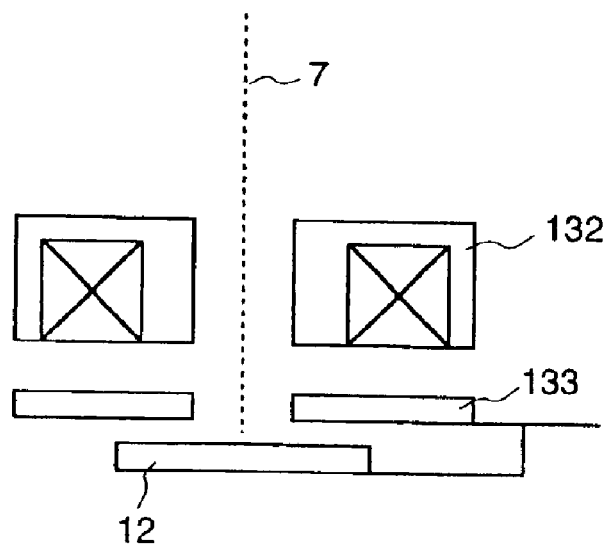
FIG. 19 is a schematic block diagram explaining another means to form a deceleration field.

FIG. 19 shows one of such means. This example employs an object lens consisting of an upper magnetic pole 132 and a lower magnetic pole 133 and applying an identical negative voltage (not visible in the drawing) to both the lower magnetic pole and the specimen 12 to form a deceleration field. This lower magnetic pole is functionally the same as the control electrode 27 in FIG. 5.

Figure 20:
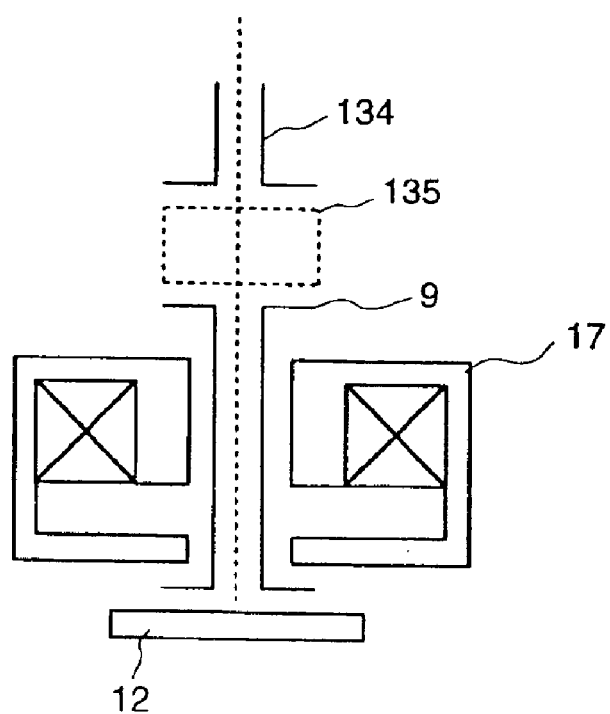
FIG. 20 is a schematic block diagram explaining another means to form a deceleration field.

FIG. 20 shows another example of means to form a deceleration field. This example forms a deceleration field between the specimen 12 and an acceleration cylinder 9 to which a positive voltage is applied. This acceleration field works to accelerate secondary signals. The secondary signals accelerated by this deceleration field are decelerated by a grounding potential area 135 and lose almost all of their energy in this area 135. These secondary electrons without energy are deflected out of the motion (beam axis) of the primary electron beam by a deflection field forming means (not visible in the drawing) and deflected selectively.

The above embodiments of the present invention are all explained using scanning electron microscopes, but the present invention can be applied to all devices for observing specimens by means of electron beams, more particularly to measuring SEMs which measure widths of patterns formed on semiconductor devices and SEMs which repeatedly compare patterns and check for defective patterns.

What we claim is:

1. A specimen observing method, comprising the steps of:
   irradiating a specimen supplied with a negative voltage with an electron beam to generate secondary electrons from the specimen,
   forming a negative potential field such that the secondary electrons are retarded,
   deflecting and detecting the retarded secondary electrons to obtain a specimen image on the basis of the retarded secondary electrons, and
   adjusting the negative voltage so as to cancel charge-up of the specimen.

2. A specimen observing method according to claim 1, wherein the step of adjusting the negative voltage is so performed that the specimen image has a given image contrast.

3. A specimen observing method according to claim 1, wherein the step of adjusting the voltage is performed while monitoring an output of a secondary electron detector detecting the generated secondary electrons so that the output shows a maximum.

4. A specimen observing method, comprising the steps of:
   irradiating a specimen supplied with a negative voltage with an electron beam to generate secondary electrons from the specimen,
   forming a negative potential field such that the secondary electrons are retarded,
   deflecting and detecting the retarded secondary electrons to obtain a specimen image on the basis of the retarded secondary electrons, and
   adjusting the negative voltage while monitoring an output of a secondary electron detector detecting the secondary electrons to determine a value of the negative voltage at which the output has a maximum value.

5. A scanning electron microscope which comprises:
   an electron source emitting a primary electron beam,
   a focusing lens focusing the primary electron beam,
   a deflector deflecting the primary electron beam to irradiate a specimen with the focused primary electron beam so as to generate secondary electrons from the specimen;
   a detector detecting the secondary electrons;
   a negative voltage supplying source supplying the specimen and the deflector with a negative voltage such that the secondary electrons are retarded, and
   a controller adjusting the negative voltage to determine a value thereof at which the output shows a maximum.

6. A scanning electron microscope according to claim 5, wherein the secondary electron detector comprises a secondary electron multiplier and the controller adjusts the negative voltage while monitoring an output of the secondary electron multiplier.

* * * * *